US012716929B2

(12) United States Patent
Ding et al.

(10) Patent No.: US 12,716,929 B2
(45) Date of Patent: Aug. 25, 2026

(54) DYNAMIC LINE RATING (DLR) OF OVERHEAD TRANSMISSION LINES

(71) Applicant: NEC Laboratories America, Inc., Princeton, NJ (US)

(72) Inventors: Yangmin Ding, East Brunswick, NJ (US); Ting Wang, West Windsor, NJ (US); Yue Tian, Princeton, NJ (US); Sarper Ozharar, Pennington, NJ (US)

(73) Assignee: NEC Corporation, Tokyo (JP)

( * ) Notice: Subject to any disclaimer, the term of this patent is extended or adjusted under 35 U.S.C. 154(b) by 421 days.

(21) Appl. No.: 18/485,235

(22) Filed: Oct. 11, 2023

(65) Prior Publication Data

US 2024/0133937 A1 Apr. 25, 2024

Related U.S. Application Data

(60) Provisional application No. 63/415,690, filed on Oct. 13, 2022.

(51) Int. Cl.
*G01R 31/08* (2020.01)

(52) U.S. Cl.
CPC ......... *G01R 31/085* (2013.01); *G01R 31/088* (2013.01)

(58) Field of Classification Search
CPC ........................... G01R 31/058; G01R 31/088
See application file for complete search history.

(56) References Cited

U.S. PATENT DOCUMENTS

2020/0005036 A1* 1/2020 Ji .............................. G06T 5/70
2021/0344429 A1* 11/2021 Rhodes .................. H04B 13/02

FOREIGN PATENT DOCUMENTS

CN 102340139 A * 2/2012
CN 105787270 B * 6/2018 ............... G06N 3/02
CN 113049909 A * 6/2021 ............. G01H 9/004
KR 20140041979 A * 4/2014 ............. G06Q 50/06

* cited by examiner

*Primary Examiner* — Andrew Schechter
*Assistant Examiner* — Kaleria Knox
(74) *Attorney, Agent, or Firm* — Vincent Duffy

(57) ABSTRACT

Systems, methods, and structures providing dynamic line rating (DLR) for overhead transmission lines based on distributed fiber optic sensing (DFOS)/distributed temperature sensing (DTS) to determine temperature of the electrical conductors. Environmental conditions such as wind speed, wind direction, and solar radiation data, are collected from environmental sensors and an acoustic modem that convert the digital data collected from the environmental sensors into generated vibration patterns that are subsequently used to vibrationally excite a DFOS optical sensor fiber. The DFOS system monitors the optical sensor fiber and detects, measures, and decodes the vibrational excitations. An Artificial Neural Network (ANN) determines a heat transfer correlation between the temperature of the optical sensor fiber and electrical conductor(s) (core temperature).

5 Claims, 6 Drawing Sheets

DYNAMIC LINE RATING (DLR) OF OVERHEAD TRANSMISSION LINES

CROSS-REFERENCE TO RELATED APPLICATIONS

This application claims the benefit of U.S. Provisional Patent Application Ser. No. 63/415,690 filed Oct. 13, 2022, the entire contents of which is incorporated by reference as if set forth at length herein.

FIELD OF THE INVENTION

This application relates to distributed fiber optic sensing (DFOS) systems, methods, and structures. More particularly, it pertains to dynamic line rating (DLR) of overhead transmission lines using DFOS.

BACKGROUND OF THE INVENTION

The maximum power flow capacity of an electrical transmission line is limited by the maximum allowable temperature of the conductors. When the temperature exceeds its maximum value, it will cause unacceptable line sag and additional aging of the conductor itself. In addition to the steady or time-varying electrical current, conductor temperature depends on ambient weather conditions which include ambient temperature, wind speed, wind direction, and solar radiation.

Transmission lines are typically operated using a Static Rating calculated using near worst-case values for assumed weather conditions that do not take into consideration changing or favorable environmental conditions. For example, wind cooling will allow for greater transmission capacity. At its core, Dynamic Line Rating (DLR) helps system operators determine the prevailing current carrying capacity limits of transmission lines based on precise knowledge of real-time weather conditions. As a result, the current constraint of transmission lines can be adapted allowing more power to safely be transmitted on the line.

Unfortunately, however, there are various challenges to the efficient deployment of DLR. First, DLR deployments involve the installation of data collection sensors on or near an existing transmission line asset to collect real-time conductor temperature information. Second, large-scale deployment of separate communication channels such as wireless communication, and radio frequency (RF) for data collected from the field sensors. Finally, wireless and RF communication is vulnerable to cyberattacks. Traditional security products ignore RF protocols in the air and wait for issues to show up as symptoms on the wired network. While poor implementation often introduces vulnerabilities in Wi-Fi networks.

SUMMARY OF THE INVENTION

The above problems are solved and an advance in the art is made according to aspects of the present disclosure directed to DLR for overhead transmission lines based on distributed fiber optic sensing (DFOS).

Viewed from a first aspect, our inventive approach employs distributed fiber optic sensing (DFOS)/distributed temperature sensing (DTS) to determine temperature of the electrical conductors.

Viewed from another aspect, our inventive approach determines environmental conditions such as wind speed, wind direction, and solar radiation data, by converting digital data collected from environmental sensors and an acoustic modem that convert the digital data collected from the environmental sensors into generated vibration patterns that are subsequently used to vibrationally excite a DFOS optical sensor fiber. The DFOS system monitors the optical sensor fiber and detects, measures, and decodes the vibrational excitations.

Finally, and viewed from yet another aspect, an Artificial Neural Network (ANN) is employed to determine a heat transfer correlation between the temperature of the optical sensor fiber and electrical conductor(s) (core temperature). The ANN model reduces the effort to develop multi-variable heat transfer correlations and is capable of readily expanding the parameter domain.

DETAILED DESCRIPTION OF THE INVENTION

Figure 1A:
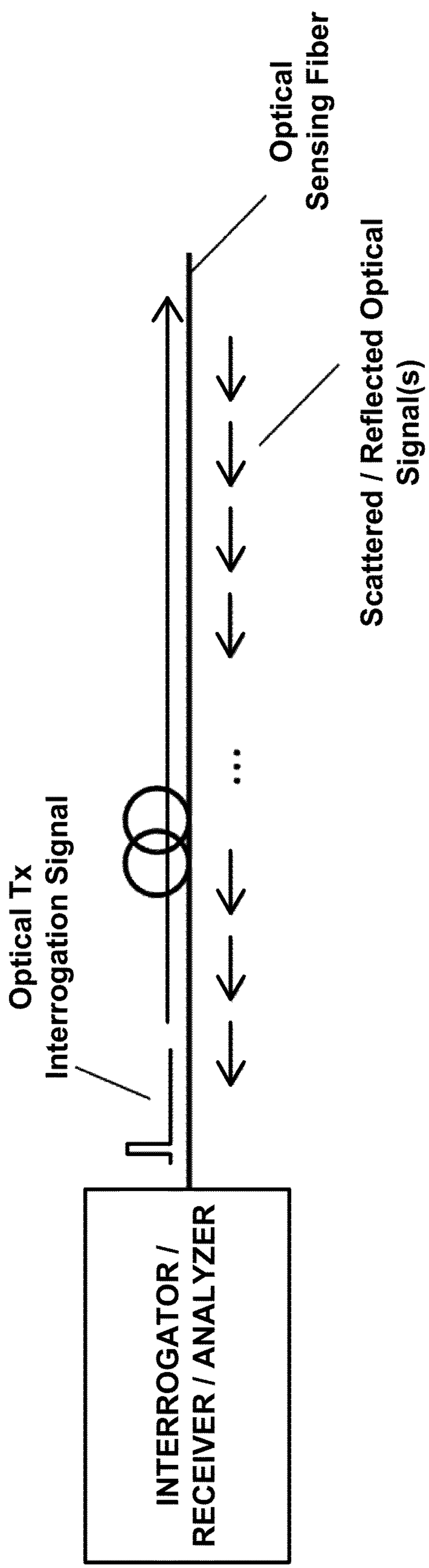
FIG. 1(A) and FIG. 1(B) are schematic diagrams showing an illustrative prior art uncoded and coded DFOS systems.

The following merely illustrates the principles of this disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

By way of some additional background, we note that distributed fiber optic sensing systems interconnect optoelectronic integrators to an optical fiber (or cable), converting the fiber to an array of sensors distributed along the length of the fiber. In effect, the fiber becomes a sensor, while the interrogator generates/injects laser light energy into the fiber and senses/detects events along the fiber length.

As those skilled in the art will understand and appreciate, DFOS technology can be deployed to continuously monitor vehicle movement, human traffic, excavating activity, seismic activity, temperatures, structural integrity, liquid and gas leaks, and many other conditions and activities. It is used around the world to monitor power stations, telecom networks, railways, roads, bridges, international borders, critical infrastructure, terrestrial and subsea power and pipelines, and downhole applications in oil, gas, and enhanced geothermal electricity generation. Advantageously, distributed fiber optic sensing is not constrained by line of sight or remote power access and—depending on system configuration—can be deployed in continuous lengths exceeding 30 miles with sensing/detection at every point along its length. As such, cost per sensing point over great distances typically cannot be matched by competing technologies.

Distributed fiber optic sensing measures changes in "backscattering" of light occurring in an optical sensing fiber when the sensing fiber encounters environmental changes including vibration, strain, or temperature change events. As noted, the sensing fiber serves as sensor over its entire length, delivering real time information on physical/environmental surroundings, and fiber integrity/security. Furthermore, distributed fiber optic sensing data pinpoints a precise location of events and conditions occurring at or near the sensing fiber.

Figure 1B:
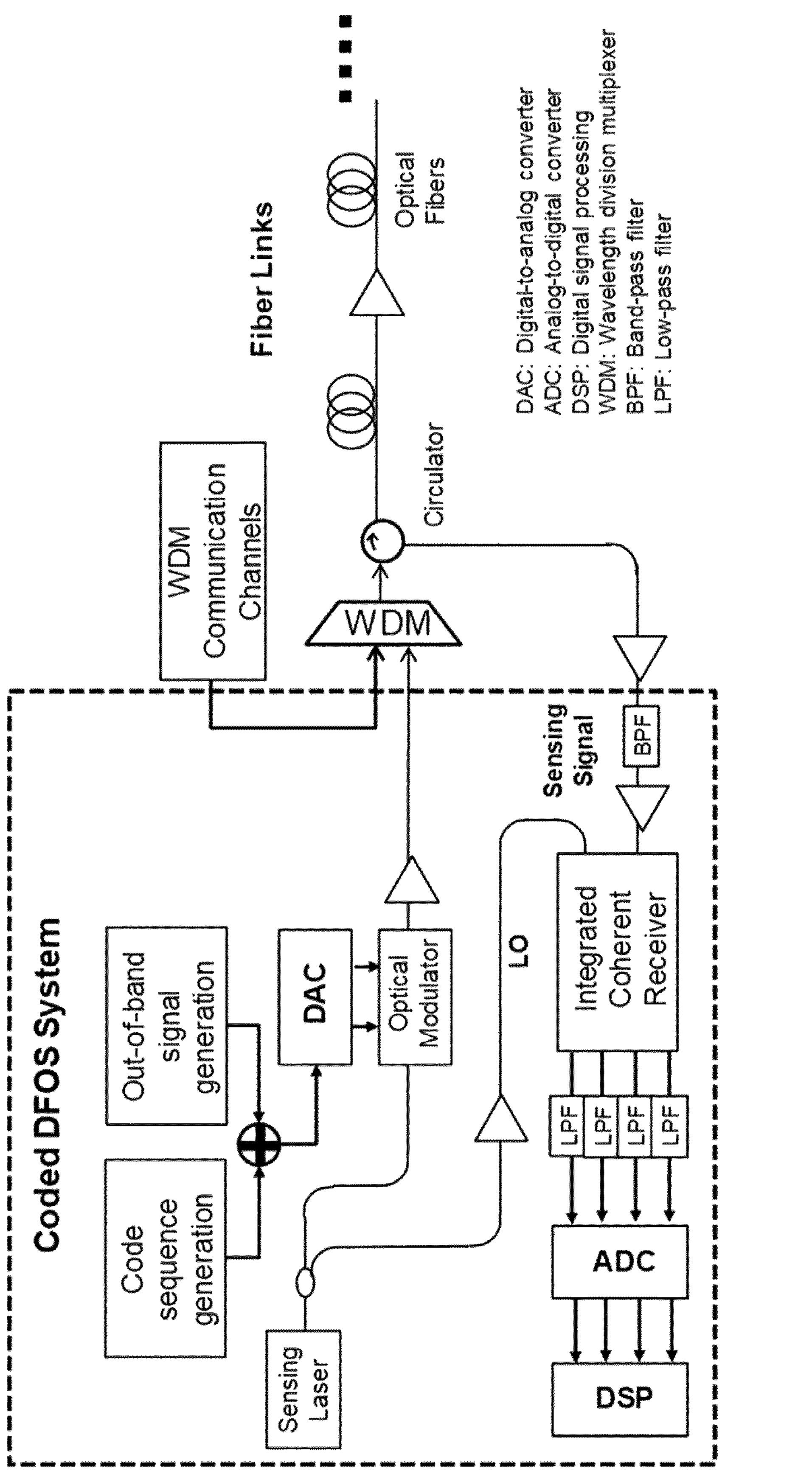

A schematic diagram illustrating the generalized arrangement and operation of a distributed fiber optic sensing system that may advantageously include artificial intelligence/machine learning (AI/ML) analysis is shown illustratively in FIG. 1(A). With reference to FIG. 1(A), one may observe an optical sensing fiber that in turn is connected to an interrogator. While not shown in detail, the interrogator may include a coded DFOS system that may employ a coherent receiver arrangement known in the art such as that illustrated in FIG. 1(B).

As is known, contemporary interrogators are systems that generate an input signal to the optical sensing fiber and detects/analyzes reflected/backscattered and subsequently received signal(s). The received signals are analyzed, and an output is generated which is indicative of the environmental conditions encountered along the length of the fiber. The backscattered signal(s) so received may result from reflections in the fiber, such as Raman backscattering, Rayleigh backscattering, and Brillion backscattering.

As will be appreciated, a contemporary DFOS system includes the interrogator that periodically generates optical pulses (or any coded signal) and injects them into an optical sensing fiber. The injected optical pulse signal is conveyed along the length optical fiber.

At locations along the length of the fiber, a small portion of signal is backscattered/reflected and conveyed back to the interrogator wherein it is received. The backscattered/reflected signal carries information the interrogator uses to detect, such as a power level change that indicates—for example—a mechanical vibration.

The received backscattered signal is converted to electrical domain and processed inside the interrogator. Based on the pulse injection time and the time the received signal is detected, the interrogator determines at which location along the length of the optical sensing fiber the received signal is returning from, thus able to sense the activity of each location along the length of the optical sensing fiber. According to aspects of the present disclosure, classification methods may be further used to detect and locate events or other environmental conditions including acoustic and/or vibrational and/or thermal along the length of the optical sensing fiber.

As noted, the present disclosure describes systems, methods, and structures that provide DLR for Overhead Transmission Lines based on distributed optical fiber sensing and an acoustic modem. DLR is known to be important as the maximum power flow capacity on a transmission line is limited by the maximum allowable temperature of the conductors. When the temperature exceeds its maximum value, it will cause unacceptable line sag and additional aging of the conductor itself. In addition to the steady or time-varying electrical current, conductor temperature depends on the ambient weather conditions which include ambient temperature, wind speed, wind direction, and solar radiation.

According to actual standards, transmission lines are typically operated using a Static Rating calculated using near worst-case values for assumed weather conditions that do not take advantage of changing or favorable environmental conditions. For example, wind cooling will allow for greater transmission capacity. At its core, Dynamic Line Rating (DLR) helps system operators determine the prevailing current carrying capacity limits of transmission lines based on precise knowledge of real-time weather conditions. As a result, the current constraint of transmission lines can be adapted thereby allowing more power to safely be transmitted on the line. However, there are various challenges to the efficient deployment of DLR.

First, DLR deployments involve the installation of data collection sensors on or near an existing transmission line asset to collect real-time conductor temperature information.

Second, large-scale deployment of separate communication channels such as wireless communication, and radio frequency (RF) for data collected from the field sensors.

Finally, wireless and RF communication is vulnerable to cyberattacks. Traditional security products ignore RF protocols in the air and wait for issues to show up as symptoms on the wired network. While poor implementation often introduces vulnerabilities in Wi-Fi networks.

Advantageously, to solve these challenges, our approach employs DFOS/distributed temperature sensing (DTS) for temperature data collection (temperature of the fiber within the conductor).

Many electric utilities are installing high-capacity fiber optic cables and wires on their high voltage lines to satisfy their own internal communication needs. Four types of optical fibers can be currently integrated into an overhead power transmission line, including Optical Ground Wire (OPGW) which is used in transmission lines on ground conductors with the fiber-optic cable embedded inside; Wrapped Round the Phase conductor or the ground wire (WRAP), a spiral-wrapped the cable around existing overhead ground conductors or in some cases, phase conductors; All Dielectric Self Supporting (ADSS) the most frequently used cable, which is self-supporting, has no metal components and can be installed on live lines without outages; Optical Fiber Composition Phase Conductor (OPPC), which is the optical cable that compounds the fiber in the phase conductor.

Distributed temperature sensing exploits the response of fiber optic cables to temperature and measures the temperature by interrogating an optical sensor fiber with an optical pulse and analyzing the Raman backscattered light. The intensity of the Raman scattering is a measure of the temperature along the length of the optical sensor fiber. With a change of temperature along the fiber, the Raman anti-Stokes signal changes its amplitude significantly. The position of the temperature reading is determined by measuring the arrival timing of the returning light pulse.

To collect the wind speed, wind direction, and solar radiation data, we use an acoustic modem to convert the digital data collected from the external sensors (wind sensor, solar radiation sensor) into vibration patterns and generate those vibrations in the vicinity of a fiber cable. A Distributed Acoustic Sensing (DAS) system monitors the said fiber cable, picks up those vibrations, measures them, decodes them, and receives the transmitted data stream, so no need for the installation of separate communication lines.

An Artificial Neural Network (ANN) is used to determine a heat transfer correlation between the temperature of fiber and conductor (core temperature). The ANN model reduces the effort to develop multi-variable heat transfer correlations and is capable of readily expanding the parameter domain.

Figure 2:
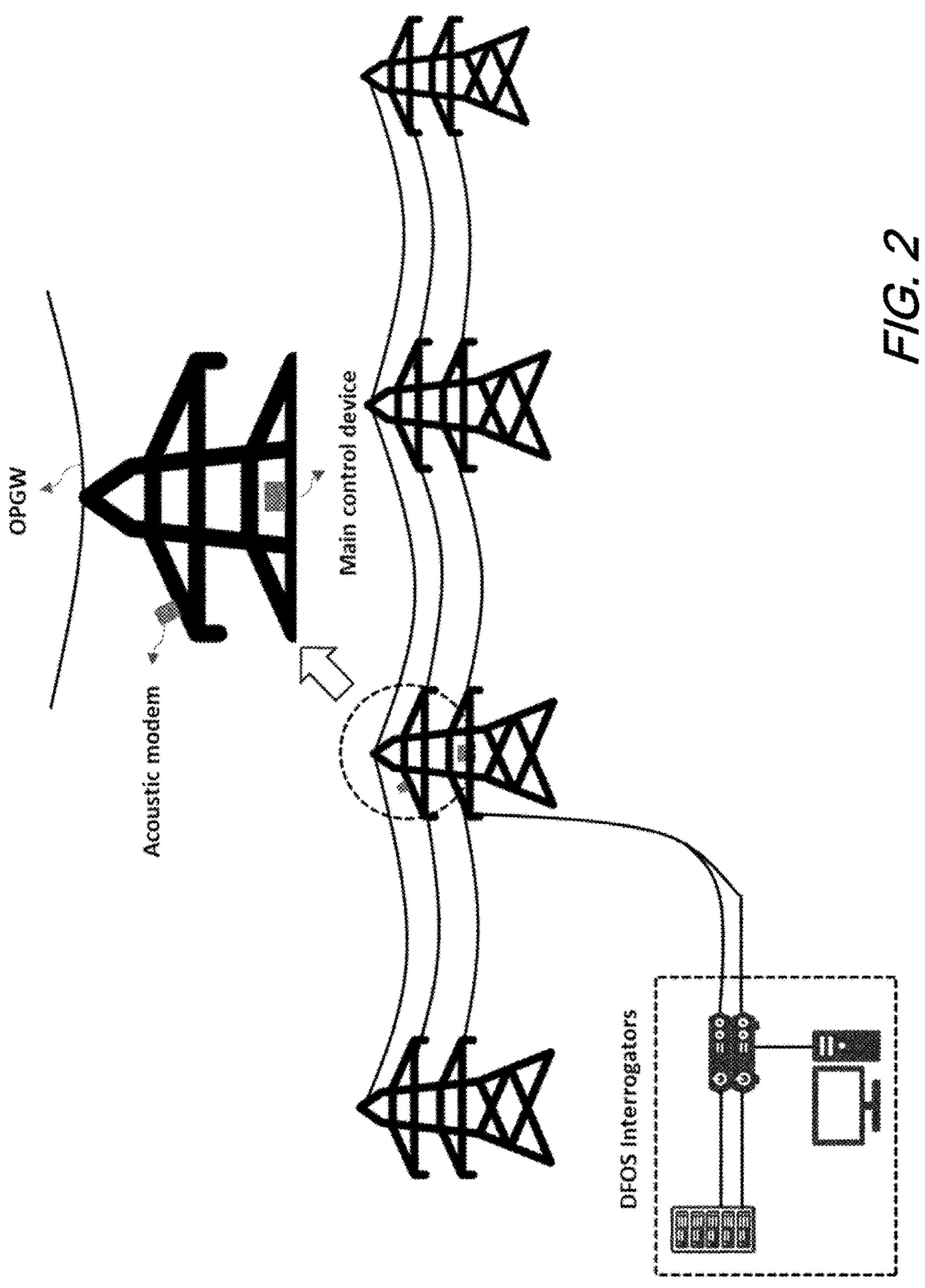
FIG. 2. Is a schematic diagram showing an illustrative DFOS systems and interrogators and acoustic modem deployment according to aspects of the present disclosure.

FIG. 2. Is a schematic diagram showing an illustrative DFOS systems and interrogators and acoustic modem deployment according to aspects of the present disclosure;

By implementing DTS for temperature data collection and communication, we have inventively reduced the burden of costly installation of external sensors and deployment of separate communication channels while ensuring efficient and secure data collection and communication based on pre-existing telecommunication cables. Our novel techniques for determining wind speed, wind direction, and solar radiation data collection, leverage DAS with the acoustic modem, as illustrated in FIG. 2.

The main controller includes sensors, solar panels, and rechargeable batteries as a backup power source. The acoustic modem includes the vibrator that is mounted on or near the OPGW cable or other types of optical fibers that are connected to the interrogator(s). A DFOS/DAS interrogates the optical sensor fiber and detects the vibrations generated by the vibrator.

Our Artificial Neural Network (ANN) model predicts conductor temperature using field data to train a model. The field data is collected from DTS, and the acoustic modem, which provides many true values for different sets of parameters.

Figure 3:
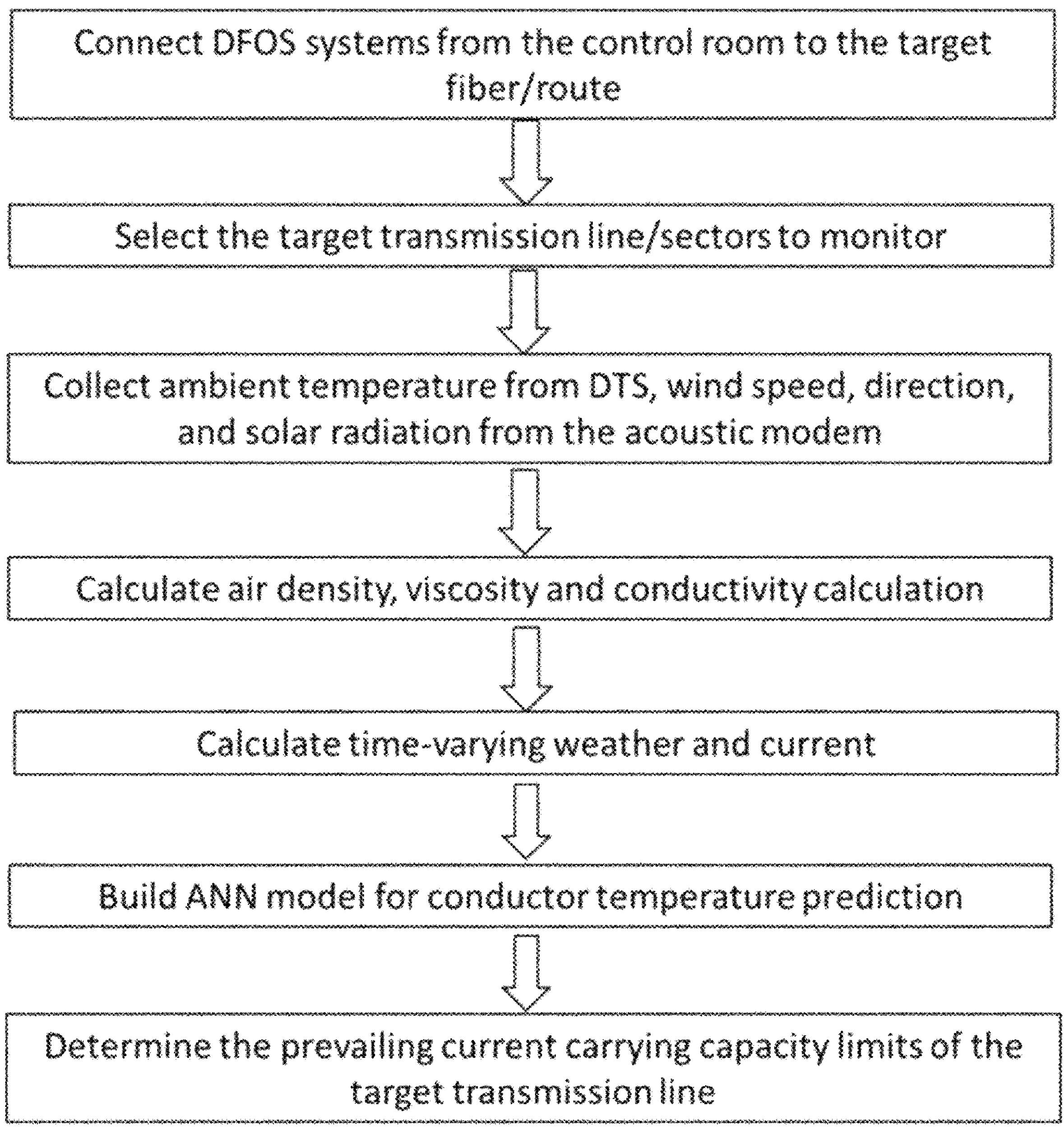
FIG. 3 is a schematic flow diagram showing an illustrative method according to aspects of the present disclosure.

FIG. 3 is a schematic flow diagram showing an illustrative method according to aspects of the present disclosure. As illustratively shown in the figure, at a first step, the DFOS system is optically connected to a target, optical sensor fiber that is deployed along an electrical transmission route of interest. At a next step, the target transmission line is selected to monitor via the DOFS. At a next step, ambient temperature is measured/detected via DFOS/DTS along with wind speed, direction, and solar radiation that is provided an acoustic modem field deployed in an area of interest. At the next step, air density, viscosity, and conductivity are calculated, followed, by a next step, that calculates time-varying weather and current(s). At a next step, an ANN model for conductor temperature prediction is built, and using that model, prevailing current carrying capacity limits of the target transmission line are determined.

Selection of Air Temperature and Wind Conditions for Line Ratings

Weather conditions have a major influence on the thermal loading of bare overhead conductors. The conductor heat loss primarily results from $q_r$ the radiated heat loss rate per unit length and $q_c$ convection heat loss rate per unit length, to the ambient air. The degree of cooling depends on air temperature and wind speed, and a wind direction perpendicular to the conductor. In the proposed method, the air temperature is represented by the internal temperature of the fiber collected from DTS, while the wind speed, wind direction, and solar radiation are collected from the acoustic modem.

Air Density, Viscosity, and Conductivity Calculation

The air density, viscosity, and thermal conductivity are a function of the ambient temperature and the conductor surface temperature, which can be calculated from the following equations. Air density is also a function of elevation above sea level. In this proposed method, the highest altitude that is applicable at the locations of the line is selected which tends to give the most conservative results.

Air density is a function of elevation above sea level and air temperature in the conductor boundary layer and given by:

$$\rho_f = \frac{1.293 - 1.525 * 10^{-4} * H_e + 6.379 * 10^{-9} * H_e^2}{1 + 0.00367 * T_{film}}$$

Where:

$H_e$ elevation of the conductor above sea level;

$T_{film}$ the average temperature of the boundary layer, $$\frac{T_s + T_a}{2},$$

$T_s$ conductor surface temperature; and $T_a$ ambient air temperature.

Thermal conductivity of air $k_f$ is a function of the air temperature in the boundary layer and given by:

$$k_f = 2.424 * 10^{-2} + 7.477 * 10^{-5} * T_{film} - 4.407 * 10^{-9} T_{film}^2$$

Dynamic viscosity of air $u_f$ is determined by the following equation:

$$u_f = \frac{1.458 * (T_{film} + 273)^{1.5}}{383.4 + T_{film}}$$

Conduct heat capacity $mC_p$ is the sum of products of specific heat $C_{pi}$ and mass per unit length ($m_i$) of its $i^{th}$ components.

Time-Varying Weather and Current Calculations

As mentioned in previous sections, the temperature of an overhead power conductor is constantly changing in response to the change in weather and electrical current. The change in conductor temperature $\Delta T_{avg}$ during the time interval $\Delta t$. The conductor temperature at the end of the time interval is the initial temperature plus the temperature change. For the "transient" calculation, the time step chosen should be sufficiently small concerning the thermal time constant. During this time interval, the line current and weather conditions are assumed constant. To make the numerical calculation reasonably accurate, the time interval for calculation $\Delta t'$ should be less than 10% of the conductor thermal time constant.

To begin the process of tracking the conductor temperature throughout P, assume that at the beginning of the time interval $\Delta t$, the initial electrical current in a conductor is $I_0$ and the initial temperature is $T_0$.

For each fixed time-interval, the change in conductor temperature will be based on $I_0$ and the line current and weather conditions during it.

For this first time-interval, the terms in the heat balance will be calculated for the conductor temperature at $t_0$, line current of I, air temperature $T_a$, solar heat $Q_s$, wind speed $V_w$, wind direction $W_d$.

For the first calculation interval, the temperature change is determined by the following equation:

$$\frac{dT_{avg}}{dt} = \frac{1}{mC_p}\left[R(T_{avg}) * I^2 + q_s - q_c - q_r\right]$$

Where:

$mC_p$ is the total heat capacity of the conductor;

$R(T_{avg})$ is the AC resistant of conductor at the average temperature'

$q_s$ heat gain rate from sun;

$q_r$ the radiated heat loss rate per unit length; and $q_c$ convection heat loss rate per unit length.

The change of the average conductor temperature therefore can be obtained as:

$$T_{avg} = \frac{1}{mC_p}\left[R(T_{avg}) * I^2 + q_s - q_c - q_r\right] * \Delta t'$$

During the next Δt' calculation interval, the weather conditions and line current remain the same, but the conductor temperature used to calculate the heat balance terms changes to $T_0+T_{avg}$. After the time interval Δt, the weather conditions and line current are adjusted to the next time interval average values and the process is repeated. When completing all the available time intervals, the conductor temperature can be plotted as a function of time.

ANN Model for Conductor Temperature

A five-layered neural network-based machine learning model is constructed to predict the conductor temperature. The numbers of neurons and hidden layers with the best prediction performance can be determined by running the model with a different number of neurons and hidden layers.

The training data includes four independent input variables, including wind speed, wind direction, fiber temperature, and solar radiation. The output parameter is conductor temperature.

The linear error function was used in the output layer and the rectified linear units (ReIU) error function was used in all the hidden layers.

The linear activation is a straight-line function where the weighted sum from the neuron (input) is proportional to the activation, which can be written as:

$$A(x) = cx$$

The ReLU is a non-linear activation function that is used in multi-layer neural networks. It can be represented as:

$$f(X) = \max(0, x), \text{ where } x \text{ is and input value}$$

Figure 4:
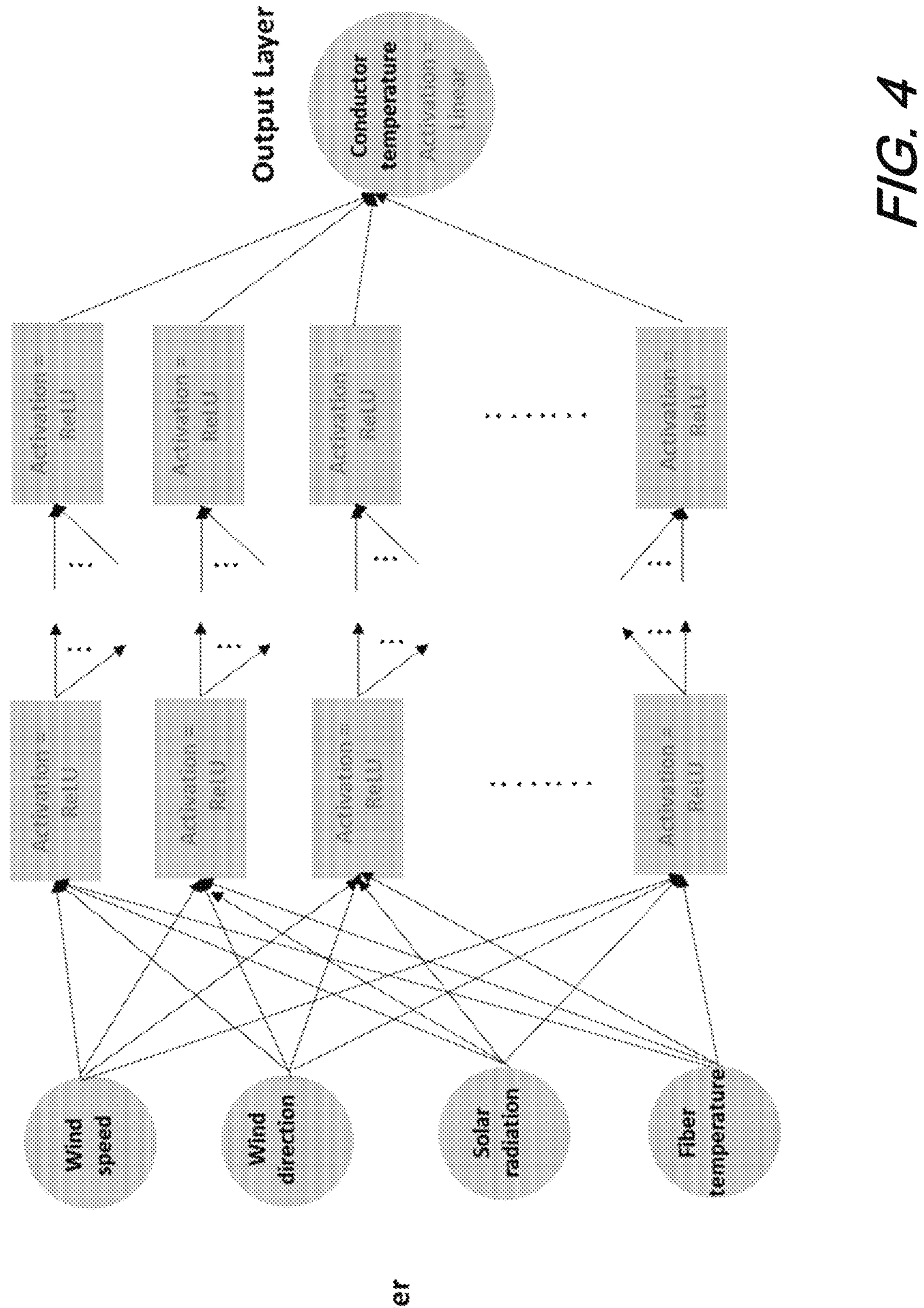
FIG. 4 is a schematic diagram showing illustrative architecture of an ANN-based model for prediction of conductor temperature according to aspects of the present disclosure.

FIG. 4 is a schematic diagram showing illustrative architecture of an ANN-based model for prediction of conductor temperature according to aspects of the present disclosure.

Figure 5:
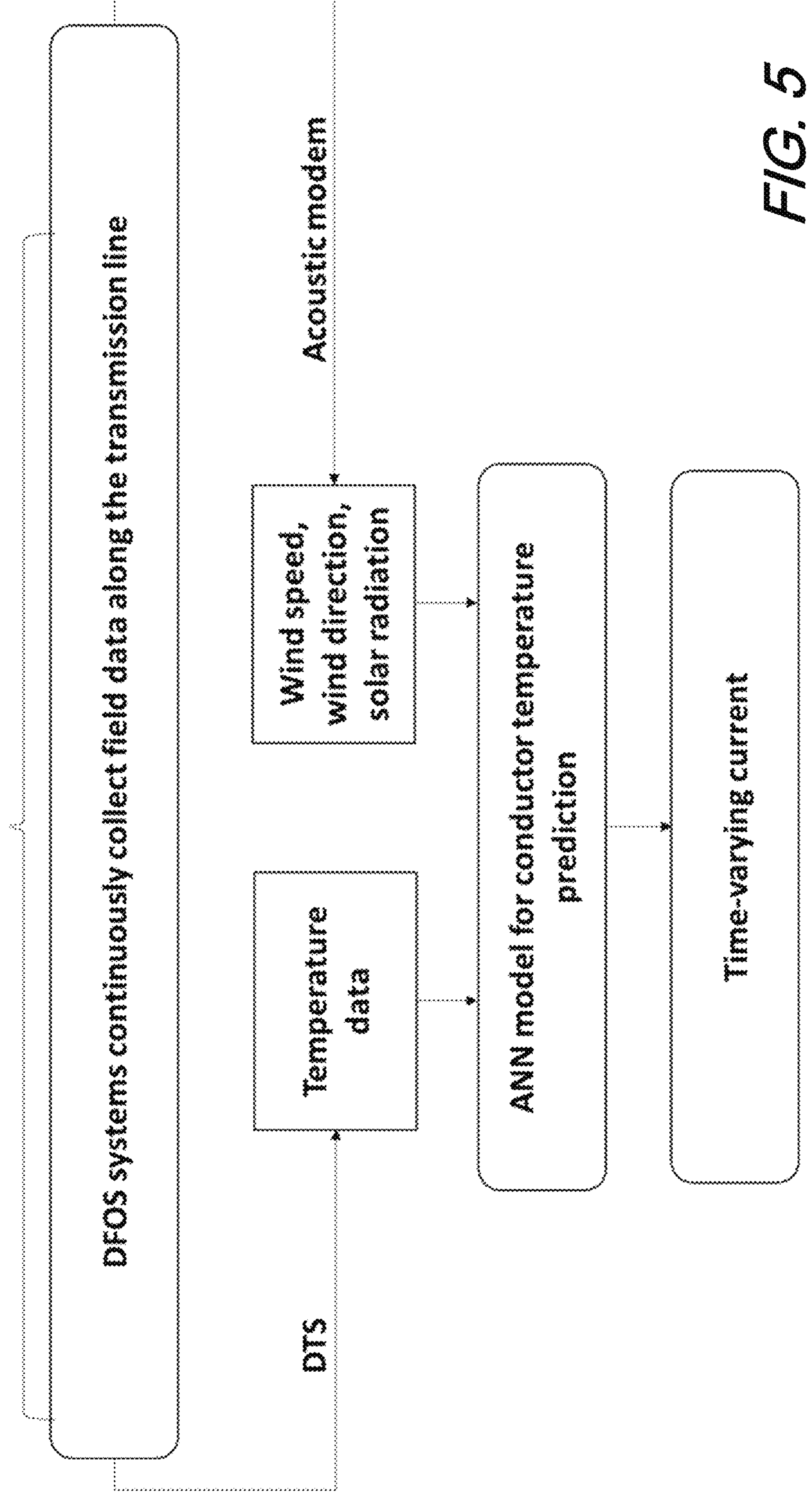
FIG. 5 is a schematic diagram showing illustrative features provided by the inventive systems, methods, and structures according to aspects of the present disclosure.

FIG. 5 is a schematic diagram showing illustrative features provided by the inventive systems, methods, and structures according to aspects of the present disclosure.

At this point, while we have presented this disclosure using some specific examples, those skilled in the art will recognize that our teachings are not so limited. Accordingly, this disclosure should only be limited by the scope of the claims attached hereto.

The invention claimed is:

1. A method of determining a distributed line rating (DLR) for overhead transmission lines, the method comprising:

configuring a distributed fiber optic sensor system (DFOS) to monitor temperature via distributed temperature sensing (DTS) and monitor wind speed, wind direction, and solar radiation measure via distributed vibration sensing (DVS);

operating the distributed fiber optic sensor system (DFOS) to monitor environmental conditions proximate to the overhead transmission lines;

determining a time-varying weather and current;

constructing an artificial neural network (ANN) model for overhead transmission line conductor temperature prediction; and using a predicted temperature, determining a current carrying capacity of the overhead transmission line conductor;

wherein wind speed, wind direction, and solar radiation measurements are made by an acoustic modem configured to provide the measurements to the DFOS via DVS; and wherein air density is determined according to the following:

$$\rho_f = \frac{1.293 - 1.525 * 10^{-4} * H_e + 6.379 * 10^{-9} * H_e^2}{1 + 0.00367 * T_{film}}$$

Where:

$H_e$ elevation of the conductor above sea level;

$T_{film}$ the average temperature of the boundary layer, $$\frac{T_s + T_a}{2},$$

$T_s$ conductor surface temperature; and $T_a$ ambient air temperature.

2. The method of claim 1 further comprising determining viscosity of air $u_f$ according to the following:

$$u_f = \frac{1.458 * (T_{film} + 273)^{1.5}}{383.4 + T_{film}}.$$

3. The method of claim 2 further comprising determining the conductivity of air $k_f$ according to the following:

$$k_f = 2.424 * 10^{-2} + 7.477 * 10^{-5} * T_{film} - 4.407 * 10^{-9} T_{film}^2.$$

4. The method of claim 3 further comprising determining a time-varying weather and current as a change in conductor temperature $\Delta T_{avg}$ during time interval $\Delta t$ according to the following:

$$T_{avq} = \frac{1}{mC_p}\left[R(T_{avg}) * I^2 + q_s - q_c - q_r\right]^* \Delta t$$

Where:

$mC_p$ is the total heat capacity of the conductor;

$R(T_{avg})$ is the AC resistant of conductor at the average temperature'

$q_s$ heat gain rate from sun;

$q_r$ the radiated heat loss rate per unit length; and $q_c$ convection heat loss rate per unit length.

5. The method of claim 4 wherein the ANN model is a five-layered neural network-based machine learning model trained to predict overhead transmission line conductor temperature wherein training data includes four independent input variables, including wind speed, wind direction, fiber temperature, and solar radiation and having an output parameter of conductor temperature.

* * * * *